(12) United States Patent
Johnson

(10) Patent No.: US 6,310,514 B1
(45) Date of Patent: Oct. 30, 2001

(54) AMPLIFIER THAT INDICATES ITS DEGREE OF CALIBRATION

(75) Inventor: Luke A. Johnson, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/464,974

(22) Filed: Dec. 16, 1999

(51) Int. Cl.[7] ............... G01R 19/00; H03F 1/02; H03B 1/00; H03M 1/00
(52) U.S. Cl. .................. 330/2; 341/126; 330/9; 327/554
(58) Field of Search .............. 330/2, 9; 327/554; 341/144, 150, 172, 126

(56) References Cited

U.S. PATENT DOCUMENTS 5,805,019 * 9/1998 Shin ............................. 330/9
6,011,433 * 1/2000 Nairn ........................... 330/2

* cited by examiner

Primary Examiner—Michael B Shingleton
(74) Attorney, Agent, or Firm—Trop, Pruner & Hu, P.C.

(57) ABSTRACT

An amplifier includes a first circuit and a second circuit. The first circuit, in a first mode of the amplifier, amplifies an input signal to produce a first output signal. The second circuit is coupled to the first circuit to cause the first circuit to, in a second mode of the amplifier, provide a second output signal that is indicative of a degree of calibration of the amplifier.

30 Claims, 5 Drawing Sheets

US 6,310,514 B1

AMPLIFIER THAT INDICATES ITS DEGREE OF CALIBRATION

BACKGROUND

The invention generally relates to an amplifier that indicates its degree of calibration, such as an amplifier that is used in a stage of a pipelined analog-to-digital converter, for example.

An analog-to-digital converter (ADC) typically is used to form an interface between a computer and its surroundings. As an example, a sensor, such as a microphone, may generate an analog signal that indicates sounds that are sensed by the microphone, and the computer may process or store indications of the sounds. However, because the computer typically processes digital data, an ADC may be used to convert the analog signal into a digital signal, a representation that is recognized by the computer.

An ADC is effectively a collection of analog devices that are fabricated on the same semiconductor die along with digital devices. Unfortunately, the fabrication process may be tailored to optimize performance of the digital devices. As a result, the fabrication process may not permit precise fabrication of sensitive analog devices of the ADC, a constraint that may compromise the accuracy of the ADC.

For example, referring to FIG. 1, one type of ADC is a pipelined ADC 10, a circuit that converts an analog input signal (called $V_{IN}$) into a digital signal by using a successive approximation technique to produce bits of the digital signal. More particularly, the ADC 10 may be formed from N pipelined stages 12 (stages $12_1$, $12_2$ and $12_N$, as examples), each of which indicates one bit of an N bit digital signal. The ADC 10 produces the bits of the digital signal one stage 12 at a time, beginning with the most significant bit (that appears at the output terminal of the stage $12_1$) and continuing in an ordered sequence along the pipeline to eventually produce the least significant bit (that appears at the output terminal of the stage $12_N$) when the conversion is complete. To begin the conversion, the stage $12_1$, (that is associated with the most significant bit) receives the $V_{IN}$ analog input signal, and a comparator 14 (of the stage $12_1$) compares the $V_{IN}$ analog input signal to a reference analog signal (called $V_{REF}$), a comparison that produces an indication of the most significant bit at the comparator's output terminal, a terminal that forms the output terminal of the stage $12_1$. The $V_{IN}$ analog input signal passes through an amplifier 16 that multiplies the $V_{IN}$ analog input signal by two, a bit order adjustment in preparation for the comparison by the lower bit order stage $12_2$. The output signal of the amplifier 16, in turn, is received by an adder 18 (of the stage $12_1$) that adds either the $V_{REF}$ analog reference signal or a $-V_{REF}$ analog reference signal to the output signal of the amplifier 16 to produce a signal (at the output terminal of the adder 18) depending on the output of comparator 14.

In this manner, when the comparator determines that $V_{IN}$ is greater than $V_{REF}$, $V_{REF}$ is subtracted from the amplifier 16 output. Similarly, when $V_{IN}$ is less than $V_{REF}$, $V_{REF}$ is added to the amplifier 16 output. This output of the adder 18 signal is known as the residue and is received by an input terminal of a comparator 14 of the stage $12_2$ that, along with the other stages 12, function similarly to the stage $12_1$, to produce the other bits of the digital signal.

The gain (ideally two) of the amplifier 16 contributes significantly to the overall accuracy of the ADC 10. The offset error may be corrected by other architectural changes not disclosed here so the gain become the dominant error contributor. The amplifier 16 may be, for example, a switched capacitor amplifier that uses a ratio of capacitances to establish its gain. Unfortunately, the digital process that may be used to fabricate the capacitors of the amplifier 16 may not permit the formation of capacitors that have precise capacitances. As a result, the actual gain of the amplifier 16 may be substantially different from the ideal gain of two, and thus, the inaccuracy that is introduced by the amplifier 16 may limit the overall accuracy of the ADC 10.

Thus, there is a continuing need for an arrangement that addresses one or more of the problems that are stated above.

SUMMARY

In an embodiment of the invention, an amplifier includes a first circuit and a second circuit. The first circuit, in a first mode of the amplifier, amplifies an input signal to produce a first output signal. The second circuit is coupled to the first circuit to cause the first circuit to, in a second mode of the amplifier, provide a second output signal that is indicative of a degree of calibration of the amplifier.

Advantages and other features of the invention will become apparent from the following description, drawing and claims.

DETAILED DESCRIPTION

Figure 1:
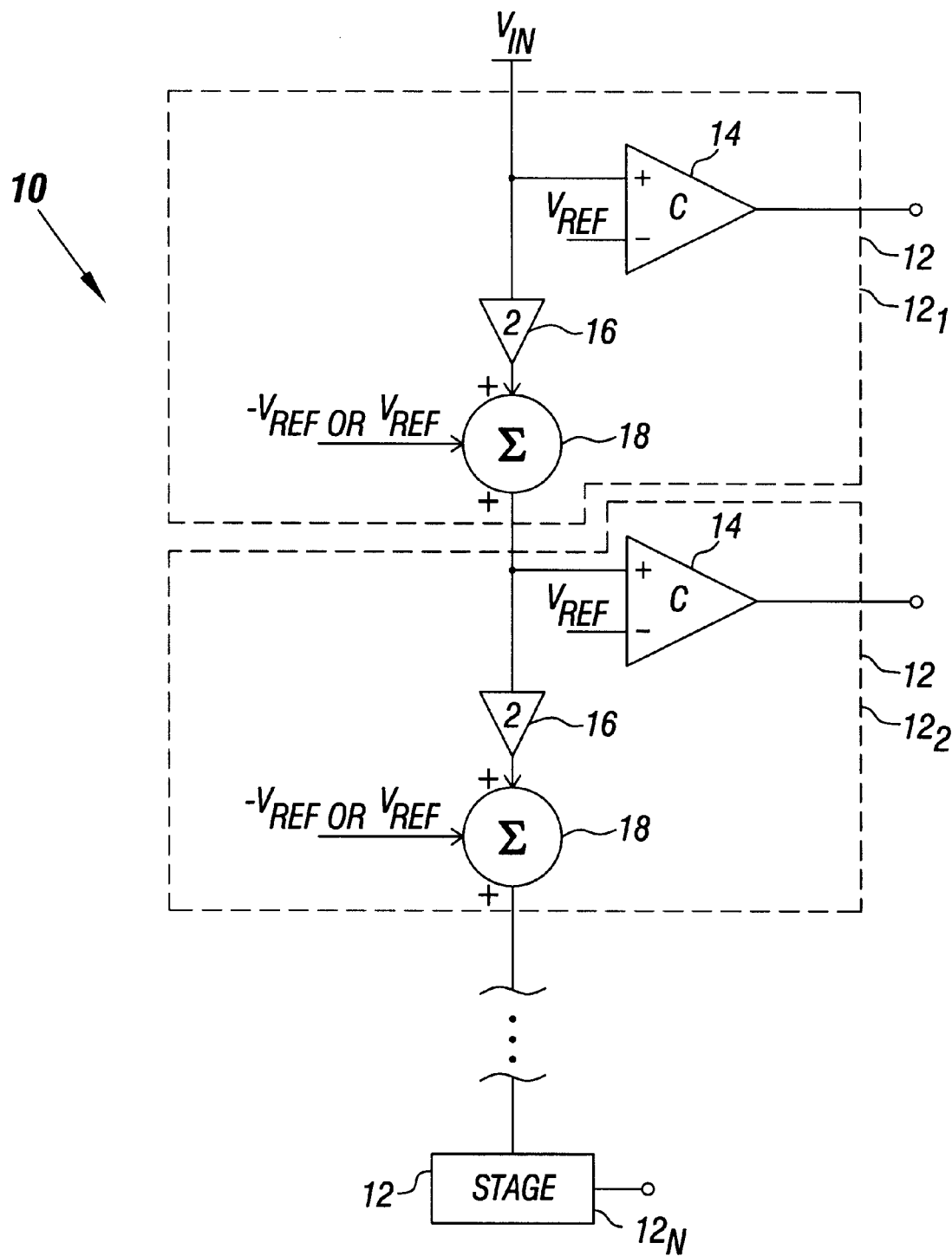
FIG. 1 is a schematic diagram of a pipelined analog-to-digital converter of the prior art.
Figure 2:
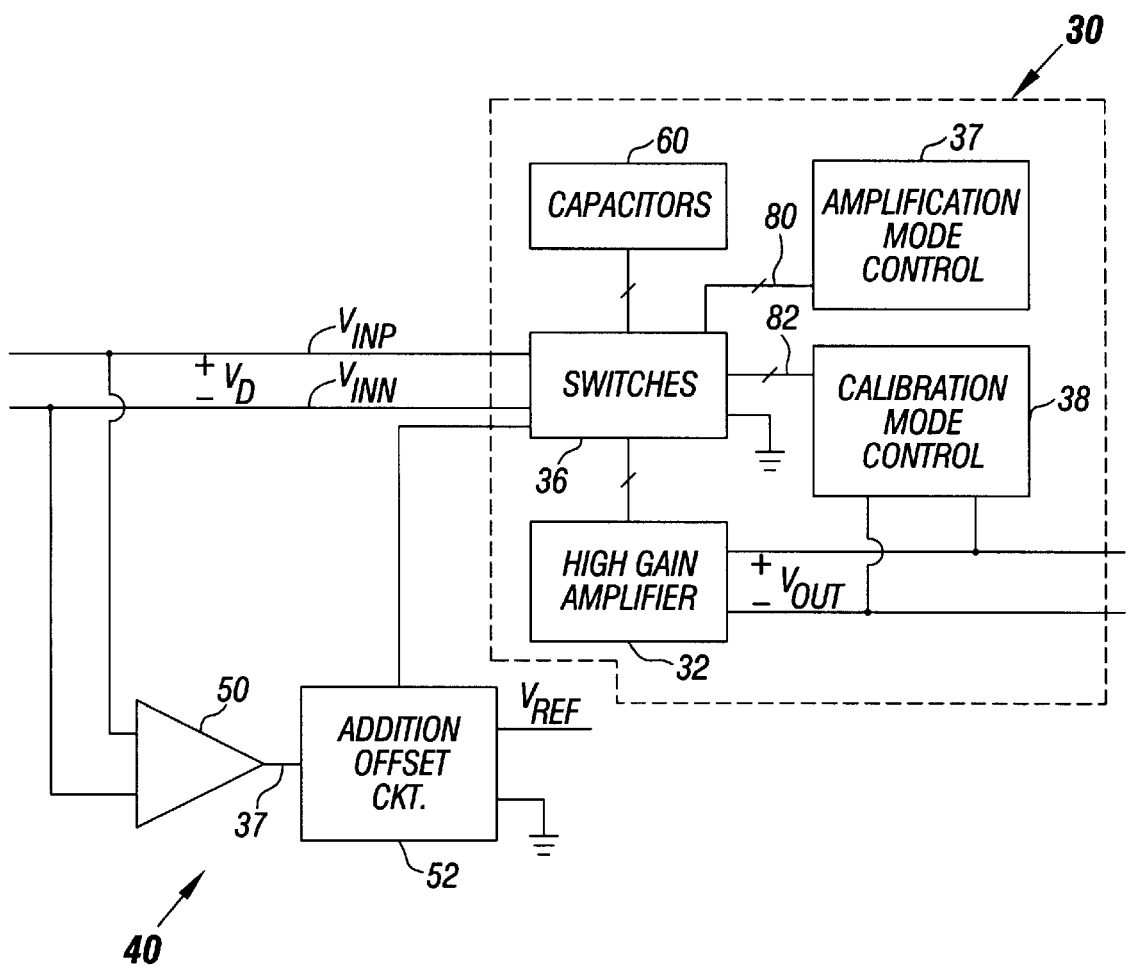
FIG. 2 is a schematic diagram of a stage of a pipelined analog-to-digital converter according to an embodiment of the invention.

Referring to FIG. 2, an embodiment 30 of an amplifier in accordance with the invention indicates its degree of calibration. Therefore, components of the amplifier 30 may be calibrated, or trimmed, until the amplifier 30 indicates that it is calibrated. As an example, a gain of the amplifier 30 may be established by the ratio of capacitors 60, a ratio that may vary due to tolerances that are introduced by the fabrication of the capacitors 60. In this manner, as described below, the amplifier 30 may provide a signal that indicates whether its gain is near a predetermined gain (two, for example), and the capacitance(s) of one or more of the capacitors 60 may be changed until the amplifier 30 indicates that is calibrated. In the following description, it is assumed that the predetermined gain is two, unless otherwise noted. However, other gains are within the scope of the invention.

More particularly, the amplifier 30 may be a switched capacitor amplifier that includes a high gain amplifier 32 (an operational amplifier, for example), switches 36 and the capacitors 60. During an amplification mode of the amplifier 30, the amplifier 30 operates the switches 36 to regulate the transfer of charge through the capacitors 60 to multiply a differential input signal called $V_D$ (a signal derived from the difference of two input signals called $V_{INP}$ and $V_{INN}$) by two to produce a differential output signal (called $V_{OUT}$) between the output terminals of the high gain amplifier 32. During a calibration mode, the amplifier 30 operates the switches 36 to regulate the transfer of charge through the capacitors 60 in a manner that causes the $V_{OUT}$ signal to indicate whether the gain of the amplifier 30 is calibrated, as described below.

For example, during the calibration mode, the $V_{OUT}$ signal may indicate whether the gain of the amplifier 30 is near the ideal gain of two. As an example, the $V_{OUT}$ signal may be near zero volts during the calibration mode to indicate calibration. Besides the components that are mentioned above, the amplifier 30 may include an amplification mode control circuit 37 that is coupled to the switches 36 (via switch control lines 80) to control the amplification mode, and the amplifier 30 may include a calibration mode control circuit 38 that is coupled to the switches 36 (via switch control lines 82) to control the calibration mode, as further described below.

In some embodiments, the amplifier 30 may be part of a stage 40 of a pipelined analog-to-digital converter (ADC). In this manner, the amplifier 30 may multiply the $V_D$ differential input signal by a gain of ideally two during the amplification mode to produce the $V_{OUT}$ signal. In addition to the amplifier 30, the stage 40 may include a comparator 50 that receives the $V_D$ differential input signal and compares the $V_D$ differential input signal to a reference signal (called $V_{REF}$). Based on the result of this comparison, an addition offset circuit 52 adds either $+V_{REF}$ or $-V_{REF}$ to the amplified signal to produce the $V_{OUT}$ signal that is provided to the next stage of the ADC.

It is noted that in some embodiments of the invention, the stage may generate 1.5 bits per stage and use the extra half bit to correct for offset errors in its high gain amplifier 32 and comparator 50. Since the function of such an architecture is complex, for purposes of clarity, the following description is based on the simpler 1 bit per stage architecture.

For purposes of amplifying the $V_D$ differential signal during the amplification mode, the amplifier 30 amplifies the $V_{INP}$ input signal by a gain of ideally two, amplifies the $V_{INN}$ input signal by a gain of ideally two and combines the amplified signals to produce the $V_{OUT}$ differential signal at the output terminals of the high gain amplifier 32. For purposes of simplifying the following description, the amplification of the $V_{INP}$ input signal is described below. However, the amplification of the $V_{INN}$ input signal occurs in similar manner.

Figure 3:
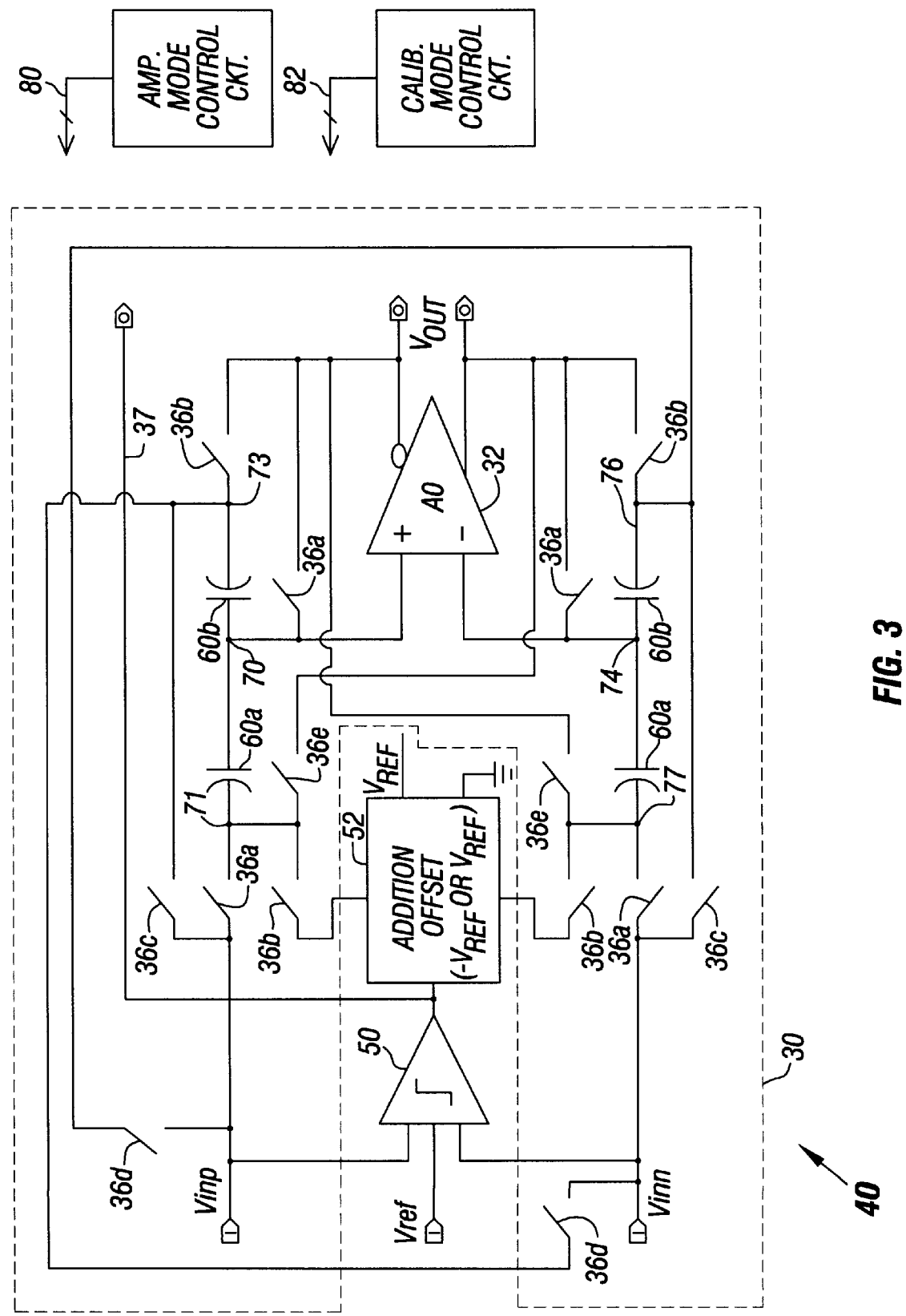
FIG. 3 is a more detailed schematic diagram of the stage of FIG. 2 according to an embodiment of the invention.
Figure 4:
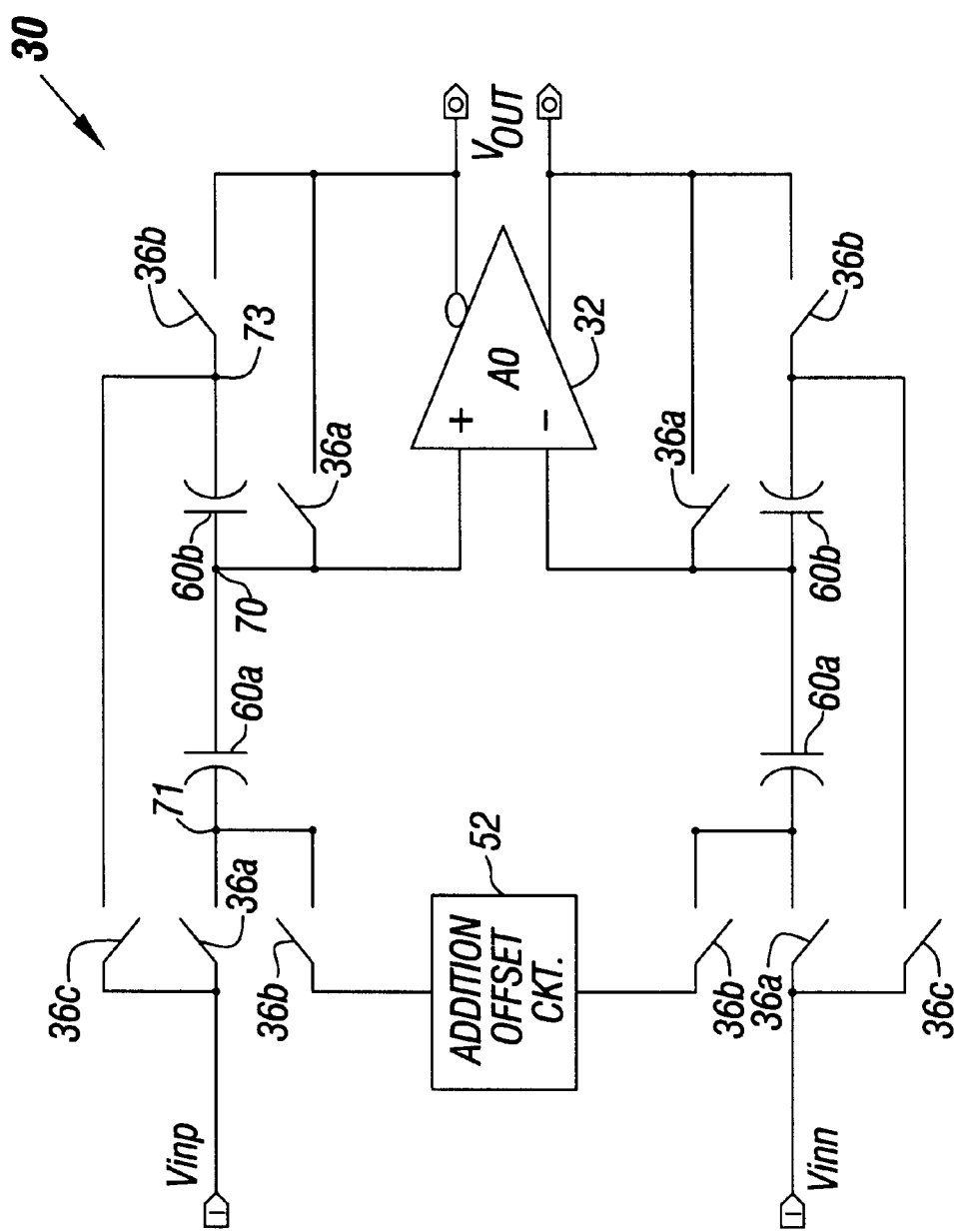
FIG. 4 illustrates operation of an amplifier of the stage in an amplification mode according to an embodiment of the invention.

Referring also to FIG. 4 that depicts a simplified schematic diagram of the stage 40 of FIG. 3 to illustrate operation of the amplifier 30 during the amplification mode, the amplification occurs during two clock phases. Phase one activates a group of the switches 36 that are denoted by the suffix "a" and the suffix "c", and phase two activates a group of the switches 36 that are denoted by the suffix "b."

During phase one, the amplification mode control circuit 37 closes the switches 36a and 36c and opens the switches 36b, and during phase two, the amplification mode control circuit 37 opens the switches 36a and 36c and closes the switches 36b. As described below, the opening and closing of the switches 36a, 36b and 36c transfers charge through capacitors 60a and 60b (some of the capacitors 60) in a manner that amplifies the $V_{INP}$ input signal. To accomplish this, the capacitors 60a and 60b have terminals that are coupled together to form a node 70. The other terminal 71 of the capacitor 60a and the other terminal 73 of the capacitor 60b are coupled to different parts of the amplifier 30, as described below.

The switches 36a and 36c, when closed during phase one, couple the $V_{INP}$ input signal to the capacitor terminals 71 and 73; and couple the positive input terminal of the amplifier 32, the negative output terminal of the amplifier 32 and the node 70 together. Due to these connections, any input offset error of the amplifier 32 is stored in the capacitors 60a and 60b. During phase two, the amplification mode control circuit 37 opens the switches 36a and 36c and closes the switches 36b. The switches 36b, when closed, couple the capacitor terminal 71 to the offset voltage circuit 52 and couple the capacitor terminal 73 to the negative output terminal of the amplifier 32 to produce an amplified version of the $V_{INP}$ signal at the positive output terminal of the amplifier 32. The offset voltage circuit 52 (see FIG. 3) adds the appropriate offset voltage ($+V_{REF}$ or $-V_{REF}$) to the terminal 71 based on the output of comparator 50. Additional capacitors 60a and 60b and switches 36a, 36b and 36c operate in a similar manner to produce an amplified version of the $V_{INN}$ signal at the negative output terminal of the amplifier 32. The differential $V_{OUT}$ signal may be described by the following equation:

$$V_{IN} \cdot \left(1 + \frac{C1}{C2} \cdot \frac{A_0}{A_0 + 1 + \frac{C1}{C2}}\right) + V_{OFF} \qquad \text{Eq. 1}$$

where "Ao" represents the gain of the high gain amplifier 32, "C1" represents the capacitance of each capacitor 60a, "C2" represents the capacitance of each capacitor 60b and "$V_{OFF}$" represents the offset voltage that is introduced by the offset addition circuit 52. If Ao is sufficiently large, then the gain that the amplifier 30 introduces to the $V_D$ signal may be simplified to the following equation:

$$\frac{V_{OUT}}{V_{IN}} = 1 + \frac{C1}{C2} \qquad \text{Eq. 2}$$

Therefore, as noted from Eq. 2, in order for the amplifier 30 to have a gain of two, the C1 and C2 capacitances must be nearly equal, i.e. the capacitance ratio should near unity. If the capacitance ratio is not near unity, the gain will be greater than or less than two.

Figure 5:
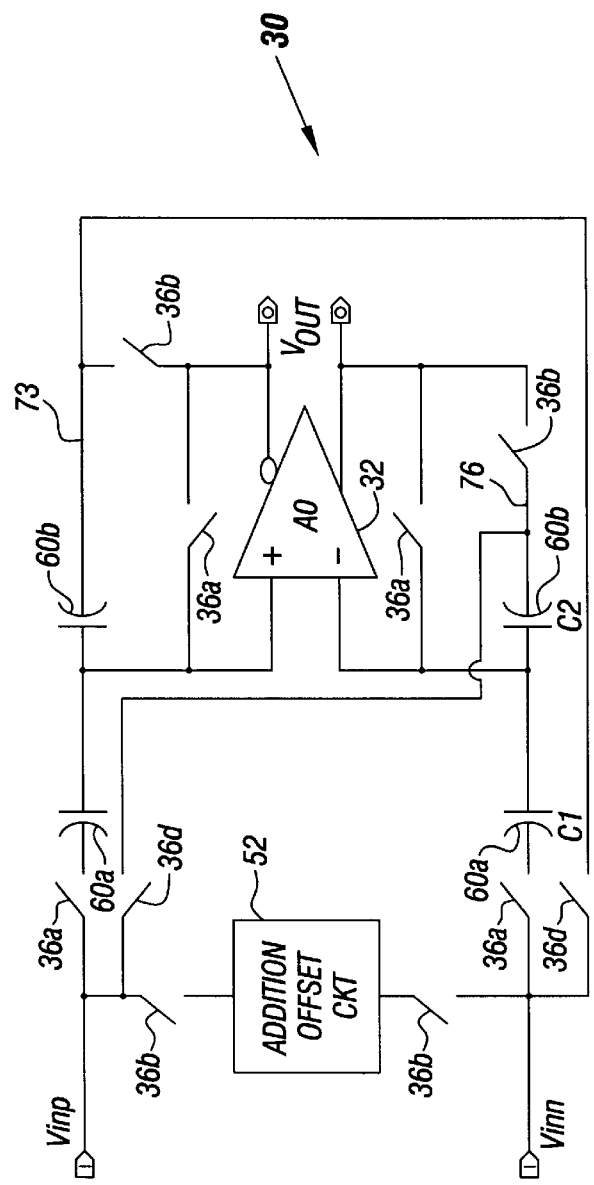
FIG. 5 illustrates operation of the amplifier in a calibration mode according to an embodiment of the invention.

For purposes of determining if the capacitance ratio is near unity (and the gain is near two), the calibration mode control circuit 38 operates the switches 36 in the calibration mode to cause the $V_{OUT}$ signal to indicate whether the gain is near two. For purposes of illustrating the switched connections that are made in the calibration mode, the schematic diagram of the amplifier 30 that is depicted in FIG. 3 is depicted in a simplified representation in FIG. 5. Similar to the amplification mode, the calibration mode has two phases. In phase two, the calibration mode control circuit 38 operates the switches 36b to make the connections described above during the amplification mode. However, the connections in phase one are different.

In particular, the switches 36b and 36c remain open in phase one. In this manner, in phase one, the calibration control circuit 38 opens the switches 36b and 36c and closes the switches 36a and 36d. During phase one, the switches 36d establish a connection between the $V_{INP}$ signal and the node 76 and a connection between the $V_{INN}$ signal and the node 73. Swapping the inputs to capacitors 60b causes $-V_{IN}$ to be stored instead of $+V_{IN}$ as during normal amplification. During phase two, the switches 36a and 36d are opened and 36b are closed just as done during the amplification mode. This arrangement produces a gain of approximately $C1/C2-1$ for the amplifier 30 during the calibration mode. Therefore, if a gain of two is desired during the amplification mode, the gain of the amplifier 30 during the calibration mode is zero, a gain that produces an output differential voltage of zero volts. If the output is greater then zero, then the C1/C2 ratio is greater then one and should be reduced. Similarly, if the output is less then zero, then the C1/C2 ratio is less then one and should be increased. It is difficult to accurately measure whether the output is two times the input, but it is relatively easy to accurately determine if the output is positive or negative. By swapping the inputs to convert the formula as described, it may easily and accurately be determined whether the capacitor ratio C1/C2 is greater or lesser than unity.

After phase two is complete, a third phase may be used to amplify the calibration output so that it can be used to control calibration circuitry. Referring back to FIG. 3, in some embodiments, during phase three, switches 36e couple the positive output terminal of the amplifier 32 to node 71 and couple the negative output terminal of the amplifier 32 to node 77 (all other switched are open). This arrangement forms a positive regenerative input to the amplifier 32 to effectively produce an offset-cancelled regenerative sense-amp or comparator. If the output at the end of phase two is positive (however slight), at the end of phase three, the output will be a positive full-swing voltage level. In the same manner, if the output at the end of phase two is negative (however slight), at the end of phase three, the output will be a negative full-swing voltage level. In this manner, when the $V_{OUT}$ output signal indicates a large negative signal, the C1 capacitance needs to be increased (or C2 decreased), and when the $V_{OUT}$ output signal indicates a large positive signal, the C1 capacitance needs to be decreased (or C2 increased).

Figure 6:
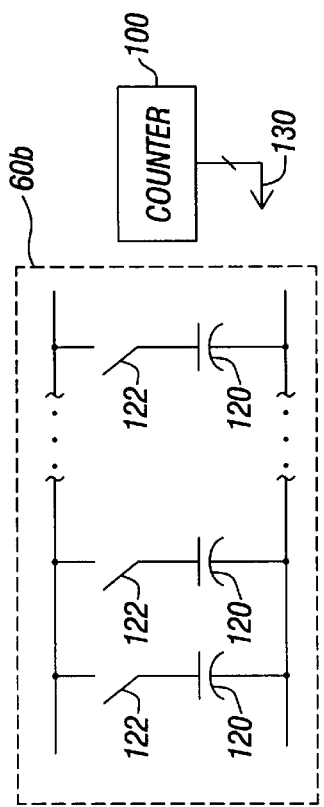
FIG. 6 illustrates operation of circuitry of the amplifier according to an embodiment of the invention.

Referring to FIG. 6, in some embodiments, each capacitor 60b may be formed from a bank of capacitors 120. In this manner, each capacitor 120 may be added to the capacitor 60b to increase the C1 capacitance via an associated switch $12_2$. A counter 100 may receive the $V_{OUT}$ signal and during another phase (phase four) count up or down according to whether the $V_{OUT}$ signal indicates a positive or a negative signal. Repeating all four phases as necessary, the circuit furnishes control signals 130 to operate the switches 12 to selectively disconnect and connect the capacitors 120 to adjust the C1 capacitance to the appropriate value, a value that places $V_{OUT}$ near zero volts.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An amplifier comprising:
    a first circuit to, in a first mode of the amplifier, amplify an input signal to produce a first output signal; and
    a second circuit coupled to the first circuit to cause the first circuit to, in a second mode of the amplifier, provide a second output signal indicative of a degree of calibration of the amplifier without reference to the input signal.

2. The amplifier of claim 1, wherein the first and second output signals appear at an output terminal of the amplifier.

3. The amplifier of claim 1, wherein
    the first circuit comprises capacitors forming a capacitance ratio that establishes a gain of the amplifier.

4. The amplifier of claim 3, wherein the second output signal indicates the capacitance ratio.

5. The amplifier of claim 3, wherein the second circuit couples the capacitors in one configuration to produce the first output signal and in another configuration to produce the second output signal.

6. The amplifier of claim 3, wherein the second circuit comprises:
    first switches coupled to the capacitors to produce the first output signal; and
    second switches coupled to the capacitors to produce the second output signal.

7. The amplifier of claim 1, wherein the first circuit amplifies the input signal by a gain to produce the first output signal and the second output signal indicates the gain.

8. The amplifier of claim 1, wherein the degree of calibration comprises a gain of the amplifier.

9. The amplifier of claim 1, wherein the second circuit causes the first circuit to be a comparator during the second mode.

10. The amplifier of claim 1, wherein the first signal causes the output signal to be near zero volts to indicate calibration of the amplifier.

11. A stage circuit usable with a pipeline analog-to-digital converter, comprising:
    a comparator to compare a first analog signal to a reference signal;
    an amplifier to, in a first mode, amplify the first analog signal to produce an amplified analog signal and in a second mode, provide a calibration signal indicative of a degree of calibration of the amplifier without reference to the first analog signal; and
    an addition offset circuit coupled to the comparator to selectively add an offset to the amplified analog signal to produce an output signal for another stage circuit based on the result of the comparison by the comparator.

12. The stage circuit of claim 11, further comprising:
    a calibration circuit to calibrate the amplifier in response to the calibration signal.

13. The stage circuit of claim 12, wherein the calibration circuit comprises:
    a counter to count in response to the calibration signal to produce a correction signal to calibrate the amplifier.

14. The stage circuit of claim 12, wherein the amplified and calibration signals appear at an output terminal of the amplifier.

15. The stage circuit of claim 11, wherein
    the amplifier comprises capacitors forming a capacitance ratio that establishes a gain of the amplifier.

16. The stage circuit of claim 15, wherein the amplified analog signal indicates if the capacitance ratio needs to be increased or decreased.

17. The stage circuit of claim 15, wherein the amplifier couples the capacitors in one configuration to produce the first output signal and in another configuration to produce the second output signal.

18. The stage circuit of claim 11, wherein the amplifier comprises:
    first switches coupled to the capacitors to produce the amplified analog signal; and
    second switches coupled to the capacitors to produce the calibration signal.

19. The stage circuit of claim 11, wherein the amplifier amplifies the analog input signal by a gain to produce the amplified analog signal and the calibration signal indicates if the gain is within a predetermined range of voltages.

20. The stage circuit of claim 11, wherein the degree of calibration comprises a gain of the amplifier.

21. A method comprising:

selectively coupling capacitors to an amplifier to introduce a first gain to an input signal to produce an amplified signal; and selectively coupling the capacitors to the amplifier to produce a calibration signal indicative of a difference between the first gain and a predetermined second gain.

22. The method of claim 21, further comprising:

causing the amplified signal and the calibration signal to appear at an output terminal of the amplifier.

23. The method of claim 21, further comprising:

using a ratio of the capacitances of the capacitors to establish the first gain.

24. The method of claim 21, wherein said selectively coupling the capacitors to the amplifier to introduce the first gain comprises selectively opening and closing a first set of switches, and selectively coupling the capacitors to the amplifier to produce the calibration signal comprises selectively opening and closing a second set of switches.

25. The method of claim 21, wherein the calibration signal is approximately zero volts when the first gain is near the second gain.

26. An apparatus comprising:

an amplifier;

capacitors; and a circuit to:

selectively couple the capacitors to the amplifier to introduce a first gain to an input signal to produce an amplified signal, and selectively couple the capacitors to the amplifier to produce a calibration signal indicative of a difference between the first gain and a predetermined second gain.

27. The apparatus of claim 26, wherein the amplifier comprises an output terminal and the circuit further causes the amplified signal and the calibration signal to appear at the output terminal.

28. The apparatus of claim 26, wherein the amplifier uses a ratio of the capacitances of the capacitors to establish the first gain.

29. The apparatus of claim 26, further comprising:

a first set of switches; and a second set of switches, wherein the circuit selectively couples the capacitors to the amplifier to introduce the first gain by selectively opening and closing the first set of switches and the circuit couples the capacitors to the amplifier to produce the calibration signal by selectively opening and closing the second set of switches.

30. The apparatus of claim 26 wherein the calibration signal is approximately zero volts when the first gain is near the second gain.

* * * * *